(12) United States Patent
Lagos

(10) Patent No.: US 6,593,699 B2
(45) Date of Patent: Jul. 15, 2003

(54) METHOD FOR MOLDING A POLYMER SURFACE THAT REDUCES PARTICLE GENERATION AND SURFACE ADHESION FORCES WHILE MAINTAINING A HIGH HEAT TRANSFER COEFFICIENT

(75) Inventor: Bryan C. Lagos, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/045,363

(22) Filed: Nov. 7, 2001

(65) Prior Publication Data
US 2003/0085204 A1 May 8, 2003

(51) Int. Cl.⁷ .............................................. B23K 10/00
(52) U.S. Cl. ............... 315/111.81; 451/41; 219/121.41; 156/345
(58) Field of Search ............... 451/41, 60, 63; 156/345; 219/121.4, 121.41, 121.42, 121.43; 315/111.01, 111.21, 111.11, 111.71, 111.81, 111.91; 118/723 E, 723 I, 723 IR, 723 AN

(56) References Cited
U.S. PATENT DOCUMENTS 4,724,325 A * 2/1988 Armstrong et al. ...... 250/443.1
6,054,007 A    4/2000 Boyd et al.
6,063,233 A * 5/2000 Collins et al. ............... 156/345
6,288,357 B1 * 9/2001 Dyer ..................... 219/121.41
6,337,281 B1 * 1/2002 James et al. ................. 438/693
6,497,613 B1 * 12/2002 Meyer .......................... 451/41

* cited by examiner

Primary Examiner—Don Wong
Assistant Examiner—Wilson Lee
(74) Attorney, Agent, or Firm—Eschweiler & Associates, LLC

(57) ABSTRACT

The invention provides a system and apparatus by which a workpiece pad is supplied to support workpieces being implanted in a rotating or spinning batch implanter process disk. The workpiece pad provides reduced surface adhesion forces and sufficient heat transfer from the workpieces to the process disk, and furthermore reduces particle generation and contamination of the workpiece from the workpiece pad. The workpiece pad furthermore comprises an ordered array of micro-structures. In addition, the invention includes a method of forming a workpiece pad comprising an ordered array of micro-structures.

33 Claims, 14 Drawing Sheets

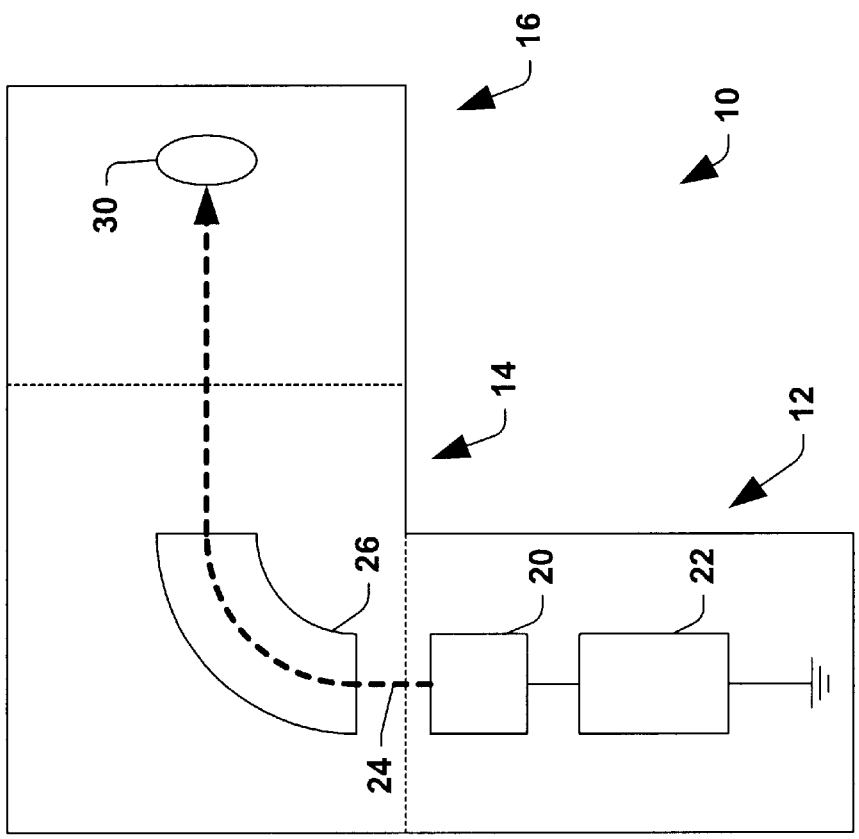

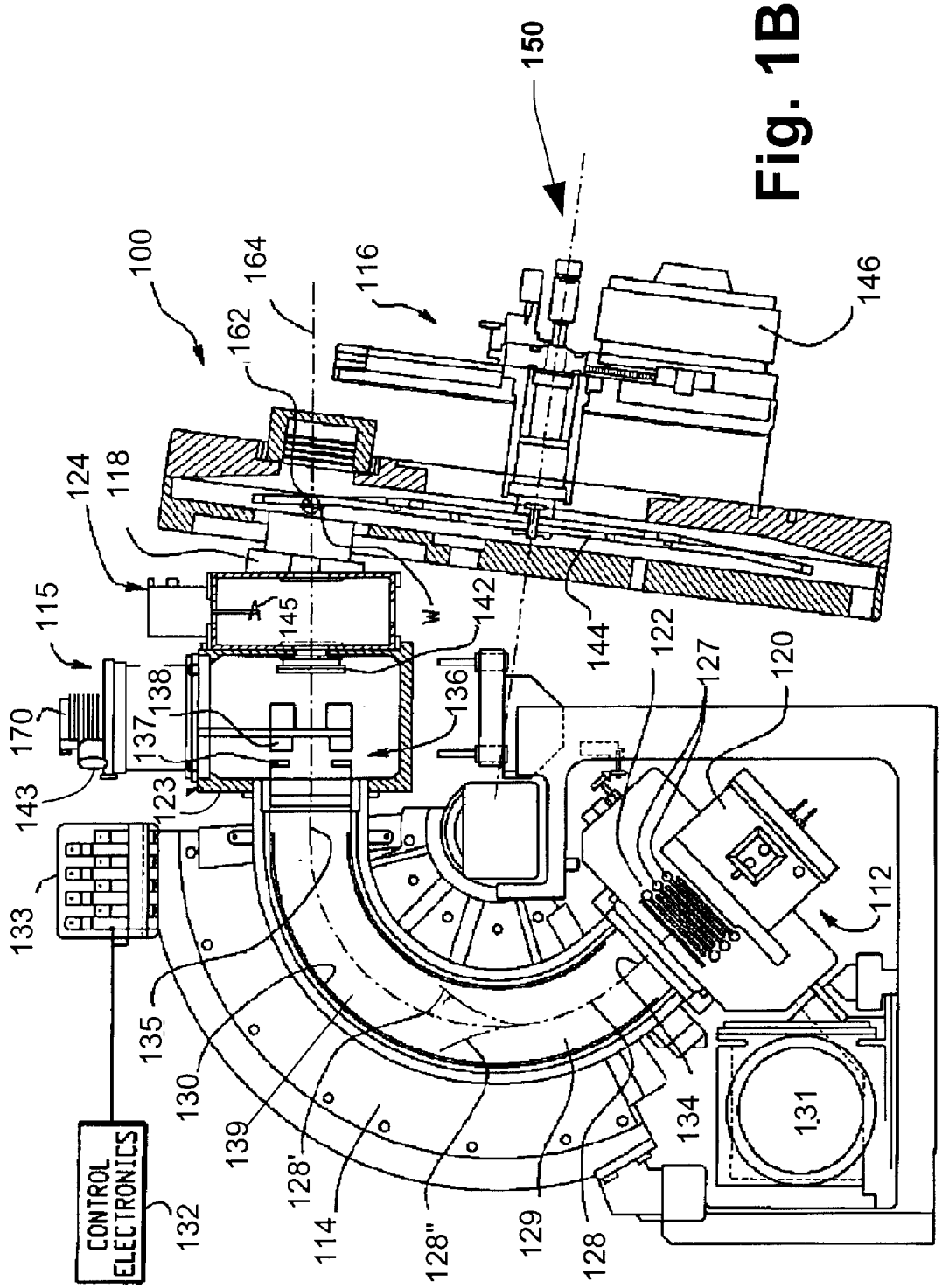

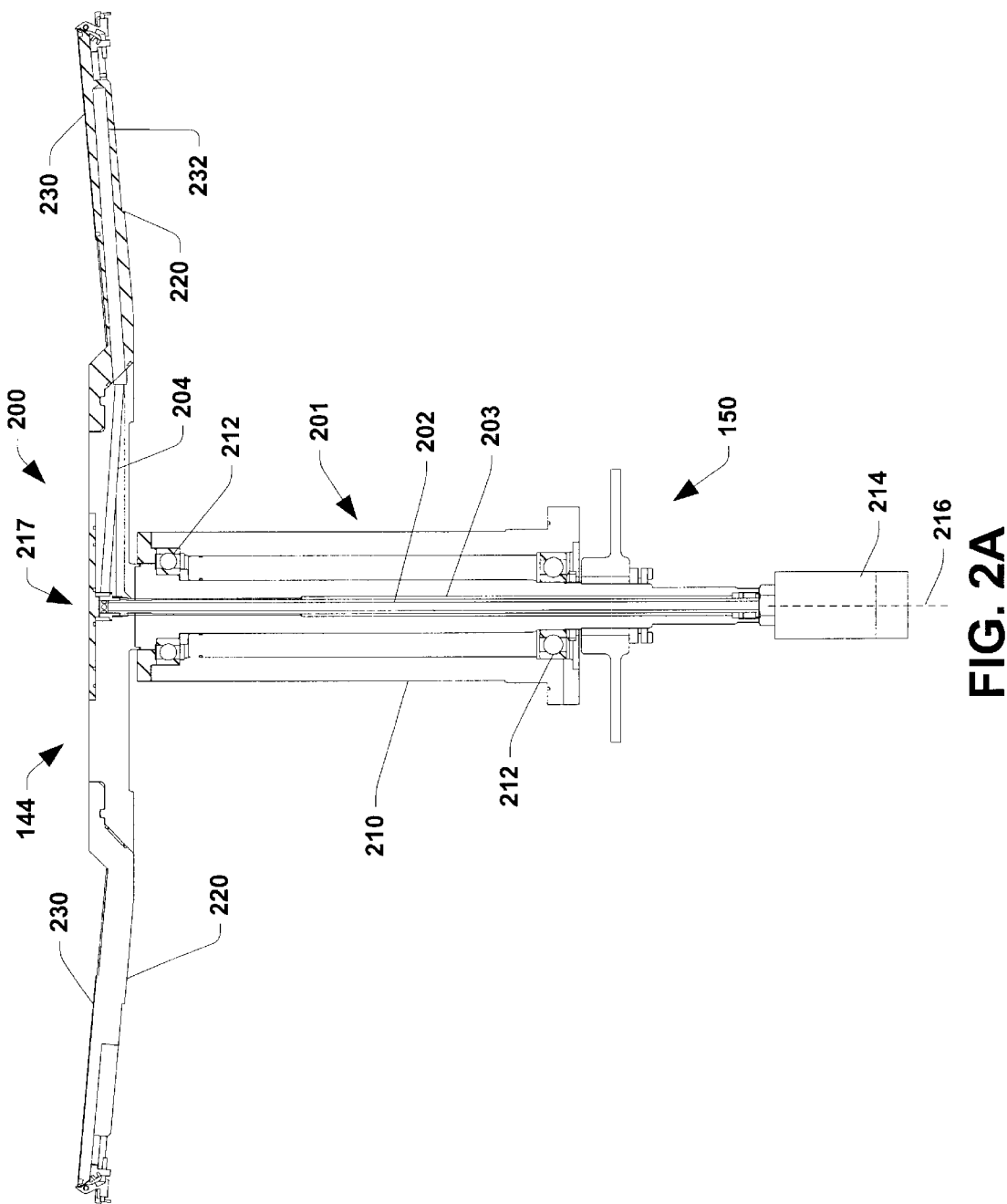

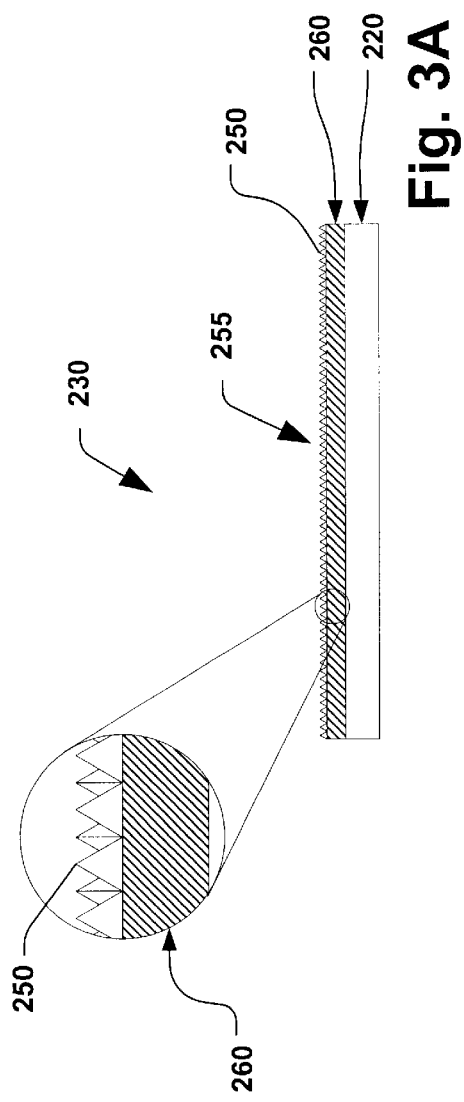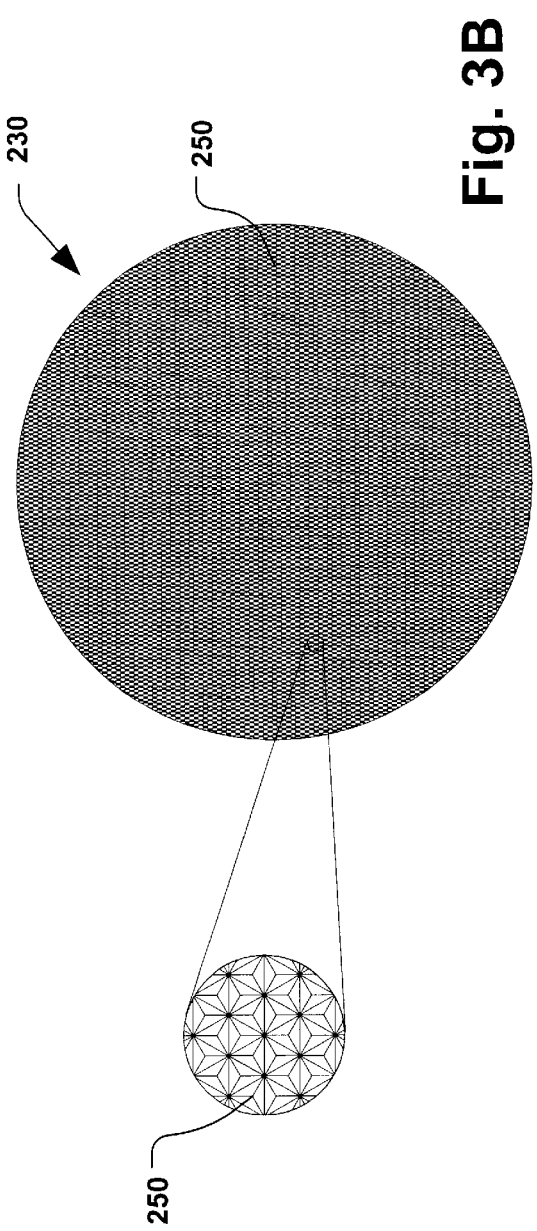

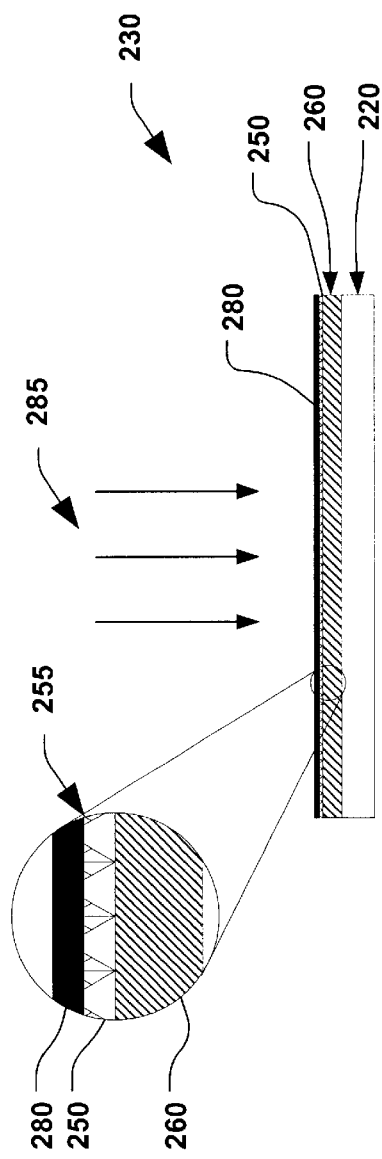
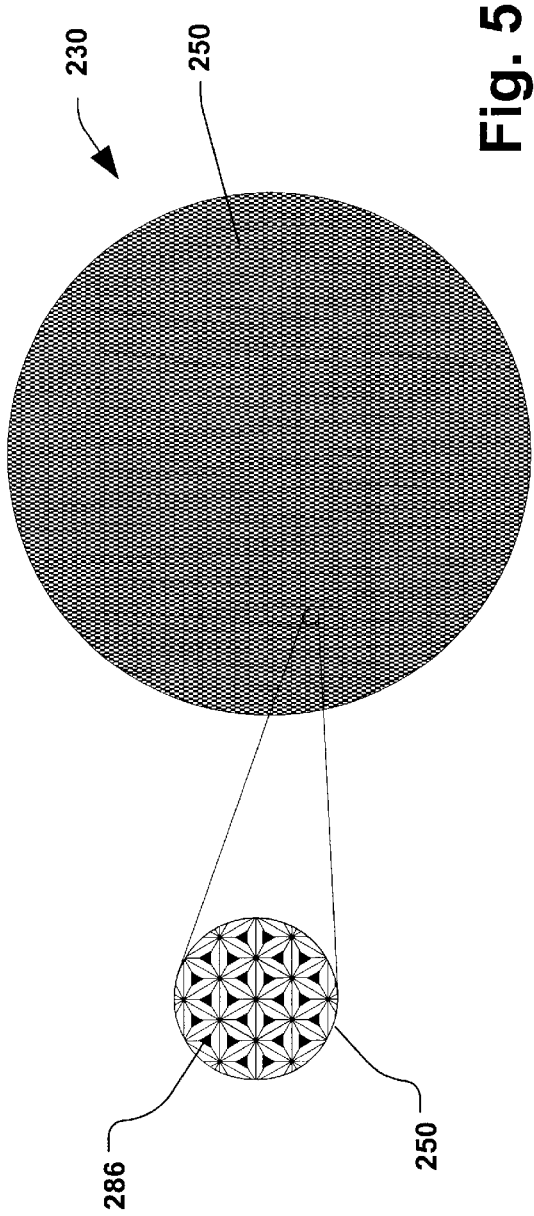

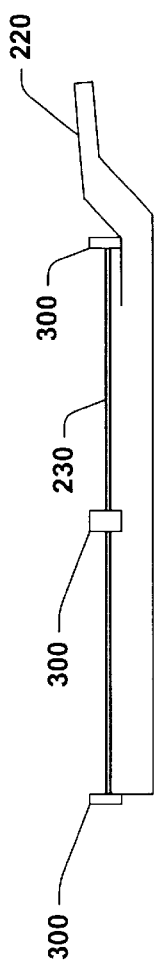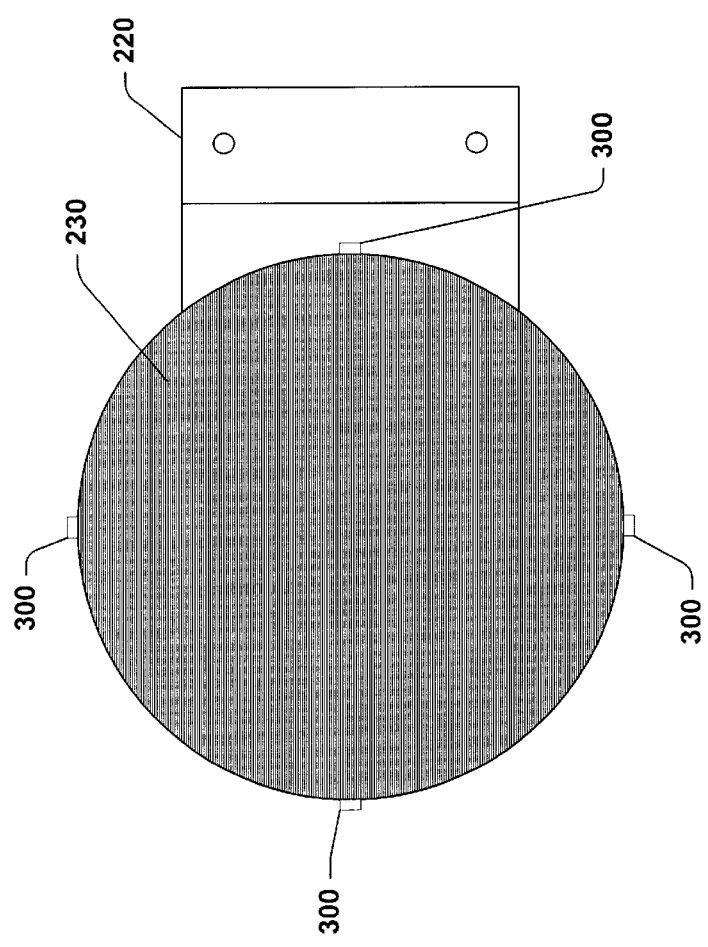

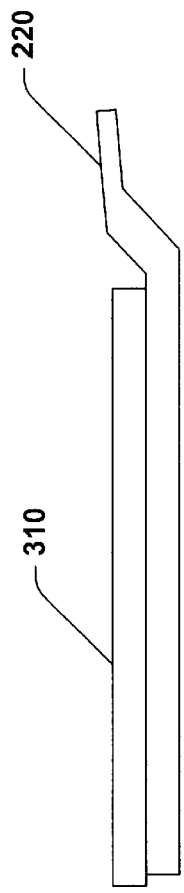
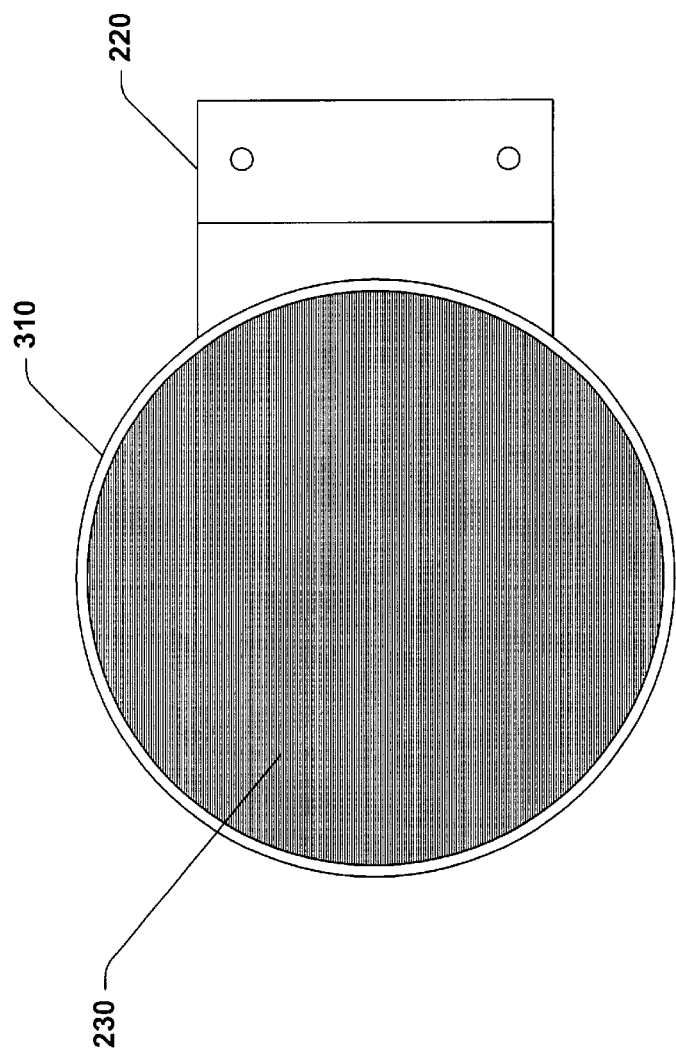

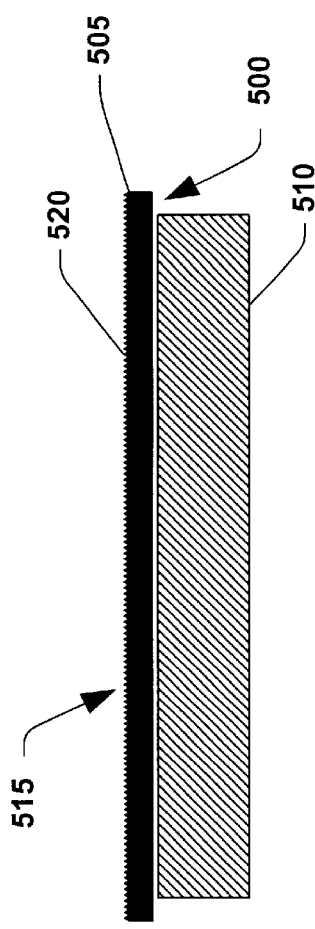
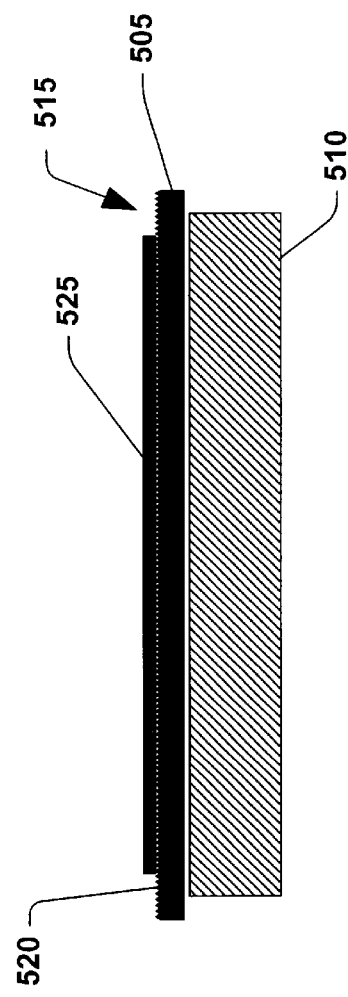
Fig. 10A
Fig. 10B

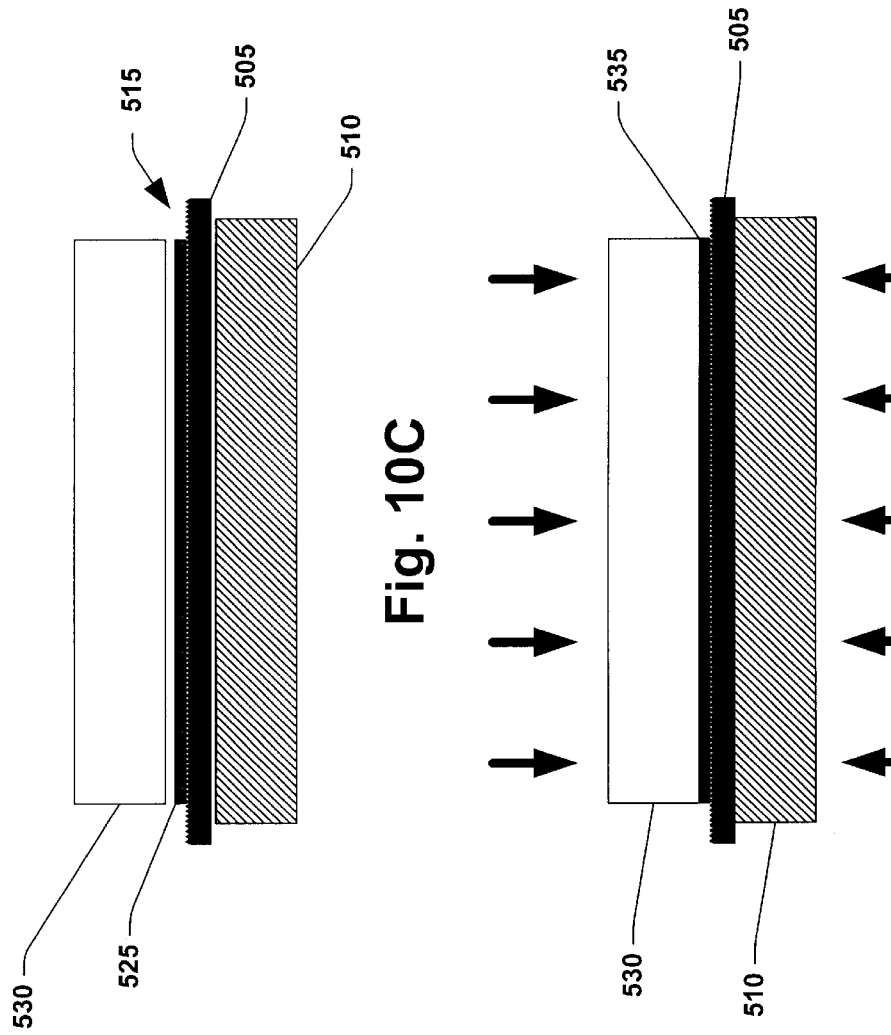

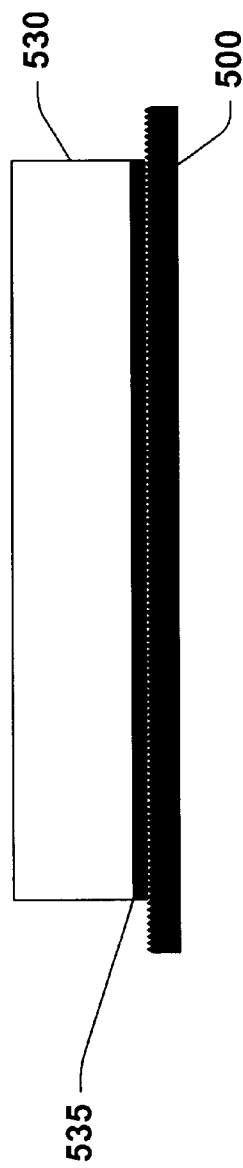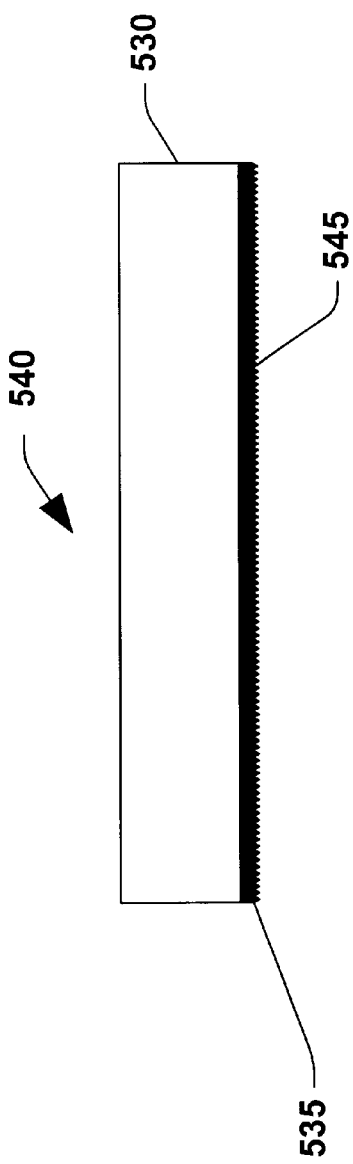

METHOD FOR MOLDING A POLYMER SURFACE THAT REDUCES PARTICLE GENERATION AND SURFACE ADHESION FORCES WHILE MAINTAINING A HIGH HEAT TRANSFER COEFFICIENT

TECHNICAL FIELD OF INVENTION

The present invention relates generally to batch ion implantation systems, and more particularly to an improved system, apparatus, and method for reducing particle generation and surface adhesion forces in a batch ion implanter, while maintaining a high heat transfer coefficient.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway must be evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

Ion implanters may be separated into two different categories. The first category includes serial ion implanters, in which semiconductor wafers or other workpieces are completely implanted with ions in serial fashion. This type of implanter includes a single workpiece pad adapted to hold or support the workpiece being implanted. The second category of ion implanters includes batch implanters, wherein a plurality of wafers or other workpieces may be implanted with ions in a single batch. The workpieces being implanted are mounted on individual workpiece pads in a rotatable process disk. The workpiece pads are typically located on individual pedestals extending outward from a center portion of the process disk at a slight angle so as to use centrifugal force to keep the workpieces seated in the pads as the process disk is rotated in a controlled fashion via a drive motor. The ion source is located so as to present ions along a beam path offset from the rotational axis of the process disk, and thereby to implant ions onto the workpieces as they rotate into the beam path. This method of ion implantation is sometimes referred to as spinning disk ion implantation.

As ions are implanted in the workpieces in a batch ion implantation process, heat is generated within each workpiece, which may cause workpiece damage or other deleterious effects if the heat is not removed from the workpiece. Conventional batch ion implantation systems and apparatus remove heat from the process disk and pedestals onto which the workpieces are mounted using internal passages through which cooling fluid such as water is circulated. Heat is removed from the workpieces to the process disk through workpiece pads comprising vulcanized rubber or RTV on which the workpieces are seated. Therefore, one function of the workpiece pads are to transfer heat from each workpiece to the process disk. Another function of the workpiece pads are to provide a tacky surface whereon each workpiece resides, whereby the workpiece can be sufficiently retained during the rotation of the process disk.

RTV workpiece pads are typically formed via a molding process, wherein liquid-state RTV material is cured after being applied to a surface of a mold which has been coated with a mold release agent. A conventional mold surface comprises a lapped metal plate, wherein a rough surface comprising substantially random peaks and valleys are formed as a result of lapping the metal plate with lapping compound. An imprint of the peaks and valleys are further transferred to the RTV workpiece pad via the molding process.

The peaks and valleys on a conventional workpiece pad formed via a lapped metal plate mold facilitate removal of the wafer from the workpiece pad after ion implantation. The rough surface on the workpiece pad is utilized to decrease a total contact area between the workpiece and the workpiece pad in order to reduce surface adhesion forces. During a conventional batch ion implantation process, for example, a workpiece such as a silicon wafer is placed on each RTV workpiece pad. The wafers are then rotated through an ion beam, whereby ions are implanted in the silicon wafers. Rotating the process disk results in an increased normal force on each workpiece pad caused by centrifugal force pushing the wafer onto the workpiece pad. This normal force compresses the RTV pad, thereby further increasing the surface contact area between the wafer and the RTV pad. This increase in surface contact area increases the heat transfer from the wafer to the pedestal, as well as increasing the surface adhesion of the wafer to the RTV pad.

One disadvantage of utilizing a lapped metal plate for the mold surface is that contaminants comprising both lapping compound and fine particles of metal created during the lapping process are typically present on the mold surface after the lapping process and cleaning thereafter. These contaminants can be transferred to the RTV pads during the molding process, and can further be transferred to the workpiece or wafer substrate when placed on the RTV pads for ion implantation. Furthermore, a mold release agent is typically utilized to prevent sticking of the RTV material to the mold surface. The mold release agent is transferred to the workpiece pad, and, if not thoroughly cleaned and removed from the workpiece pad after molding, can further be transferred to the workpiece or wafer substrate. Contaminants on the workpiece can cause many detrimental effects to the quality of the resulting ion implanted workpiece.

Another disadvantage of utilizing a workpiece pad formed via a lapped metal plate mold is poor dimensional uniformity and location of the peaks and valleys. Poor dimensional uniformity can create locations on the workpiece pad which have greater surface contact area than other locations on the workpiece pad, thus causing non-uniform surface adhesion and non-uniform heat transfer properties. Furthermore, structural dimensions of the peaks and valleys formed by utilizing the lapped metal plate mold are limited by the grain size of the lapping compound utilized during the formation of the mold. These disadvantages can cause areas of the workpiece pad which adhere non-uniformly to the wafer. Such non-uniformity of adhesion of the wafer to the workpiece pad is disadvantageous such that a removal of the wafer from the workpiece pad can cause either cracking of the wafer, or disintegration of part of the wafer or workpiece pad. Furthermore, a disintegration of the wafer or workpiece pad either contaminates the workpiece pad with remnants of the removed silicon wafer or contaminating the wafer with disintegrated parts of the workpiece pad, respectively.

Typical workpiece pads have heretofore achieved some level of heat sinking for removal of heat from workpieces, however, particles remaining from formation of the workpiece pads have been a source of contamination on the workpiece. Furthermore, workpiece pads heretofore have provided a significant amount of surface adhesion to the workpiece when placed on the workpiece pad. Therefore, improved workpiece pads are desirable, wherein the improved workpiece pads provide reduced contamination, as well as reduced adhesion forces, while still providing sufficient heat removal from the workpiece.

Consequently, there is an unresolved need for an improved batch ion implantation system and apparatus which eliminate or minimize the problems associated with conventional workpiece pads, and which provide for reduced particle contamination and surface adhesion to the workpieces, while maintaining a high heat transfer coefficient.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed to a system and apparatus which provides reduced surface adhesion forces on workpieces in a batch ion implantation operation, while reducing particle generation and maintaining a high heat transfer coefficient associated therewith. More particularly, the invention provides a workpiece pad and method of forming the same, comprising an ordered array of micro-structures, wherein a workpiece residing on the workpiece pad can be implanted with ions in a rotating or spinning batch implanter process disk. The provision of the ordered array of micro-structures allows for low particle contamination of the workpiece, while also limiting surface adhesion forces between the workpiece and the workpiece pad. Additionally, the ordered array of micro-structures allows for adequate heat transfer from the workpiece to the process disk, which may be advantageously combined with a circulation of cooling fluid through passages in the process disk to remove heat therefrom.

According to one aspect of the present invention, there is provided an ion implantation system comprising a workpiece pad having an ordered array of micro-structures. The ion implantation system further comprises a process disk mounted on a shaft for rotation about an axis, wherein the process disk is adapted to support one or more pedestals thereon. The one or more pedestals extend laterally outward from a center potion of the process disk. The workpiece pad is further mounted on the distal end of the pedestal, whereon a workpiece can reside.

According to another exemplary aspect of the present invention, the process disk comprises a plurality of pedestals extending laterally outward from a center portion of the process disk, wherein the pedestals may each include a workpiece pad radially disposed from the axis and adapted to support a workpiece thereon. The pedestals may comprise a fluid feed port in the corresponding workpiece pad, wherein fluid communication between the shaft and the workpiece pads is established. The system may further comprise a drive, such as a motor, adapted to provide rotation of the shaft with respect to the housing, and a cooling fluid source adapted to provide fluid to the back sides of the workpiece pads in order to remove heat from the workpieces as ions are implanted thereon.

According to yet another aspect of the invention, a substantially resilient workpiece pad is provided for supporting at least one workpiece in an ion implantation system. The workpiece pad comprises an ordered array of micro-structures, whereon the workpiece may reside. According to one aspect, each of the micro-structures comprises a base portion facing the pedestal and a workpiece contact portion facing the workpiece. A first cross-sectional area is associated with the base portion and a second cross-sectional area is associated with the workpiece contact portion. According to one aspect, the first cross-sectional area is greater than the second cross-sectional area, thereby resulting in a micro-structure in the general shape of a pyramid. The workpiece pad, for example, comprises a substantially resilient material such as RTV silicone, wherein a normal force exerted on the workpiece contact portion of the workpiece pad causes the plurality of micro-structures to resiliently compress. This allows the centrifugal force resulting from rotation of the workpiece in the process disk to deflect the workpiece pad to provide engagement there between, thereby resulting in an increase in a contact surface area of the workpiece pad which is in contact with the workpiece. An increase in the contact surface area results in a higher thermal conductivity between the workpiece and the workpiece pad.

According to another aspect of the invention, there is provided a retaining apparatus for retaining the workpiece on the workpiece pad. The retaining apparatus may be employed in a batch ion implanter with a rotatable process disk having at least one workpiece pad adapted to support the workpiece. According to one exemplary aspect, the retaining apparatus comprises a ring-shape retaining member mounted on the pedestal adapted to constrain the workpiece proximate the peripheral edge of the workpiece pad. According to another aspect, the retaining apparatus comprises a plurality of tabs protruding from the pedestal proximate to the peripheral edge of the workpiece pad adapted to constrain the workpiece. According to yet another aspect, the plurality of tabs are moveable with respect to the workpiece pad. In accordance with yet another aspect, the retaining apparatus comprises both moveable and stationary tabs.

In accordance with another aspect of the present invention, there is provided a method of forming a workpiece mount for an ion implantation system. The method first comprises placing a substantially flexible mold comprising a surface having an ordered array of inverted micro-structures on a substantially rigid plate, wherein the surface having the ordered array of inverted micro-structures faces away from the rigid plate. A liquified workpiece pad material is then applied to the surface of the mold. A pedestal is then applied to the liquified workpiece pad material, and the liquified workpiece pad material is further cured. Alternatively, the liquified workpiece pad material is applied to the pedestal, whereby the liquified workpiece pad material on the pedestal is further applied to the surface of the mold and cured. According to one aspect of the present invention, the workpiece pad material is cured by an addition of pressure, thus pushing the rigid plate and pedestal toward one another. According to another aspect of the present invention, the liquified workpiece pad material is cured by an addition of heat. After the liquified workpiece pad material is cured, the rigid plate is removed. The mold is further removed from the now cured workpiece pad material, thus resulting in a pedestal comprising a bonded workpiece pad, wherein the workpiece pad comprises a transferred impression of the ordered array of inverted micro-structures, and wherein no mold release agent is required to remove the mold from the workpiece pad material.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 1A is a schematic block diagram illustrating an ion implantation system in which the present invention may be employed;

FIG. 1B is a side elevation view partially in section illustrating an ion implanter for ion beam treatment of a workpiece;

FIG. 2A is a sectional side elevation view illustrating a batch implanter spindle assembly having a cooling fluid passage in a rotating shaft;

FIG. 3A is a sectional side elevation view illustrating an exemplary workpiece pad with an uncompressed ordered array of micro-structures in accordance with one aspect of the invention;

FIG. 3B is a top plan view illustrating the uncompressed ordered array of micro-structures of the workpiece pad of FIG. 3A;

FIG. 5A is a sectional side elevation view illustrating an exemplary workpiece pad with a compressed ordered array of micro-structures in accordance with one aspect of the invention;

FIG. 5B is a top plan view illustrating the compressed ordered array of micro-structures of the workpiece pad of FIG. 5A;

FIG. 7A is a sectional side elevation view illustrating an exemplary batch implanter pedestal and workpiece pad according to the invention;

FIG. 7B is a top plan view illustrating the batch implanter pedestal and workpiece pad of FIG. 7A;

FIG. 8A is a sectional side elevation view illustrating another exemplary batch implanter pedestal and workpiece pad according to the invention;

FIG. 8B is a top plan view illustrating the batch implanter pedestal and workpiece pad of FIG. 8A;

FIG. 10A is a sectional side elevation view illustrating a placement of a mold on a rigid plate in accordance with another aspect of the invention;

FIG. 10B is a sectional side elevation view illustrating an application of a liquified workpiece mount material to the mold of FIG. 10A;

FIG. 10C is another sectional side elevation view illustrating a placement of a pedestal on the liquified workpiece mount material of FIG. 10B;

FIG. 10D is another sectional side elevation view illustrating an application of pressure on the rigid plate and pedestal of FIGS. 10A–10C;

FIG. 10E is a sectional side elevation view illustrating a removal of the rigid plate of FIG. 10D; and FIG. 10F is a sectional side elevation view illustrating an exemplary workpiece pad in accordance with the present invention after removal of the mold of FIG. 10E.

DETAILED DESCRIPTION OF THE INVENTION

Figure 2B:
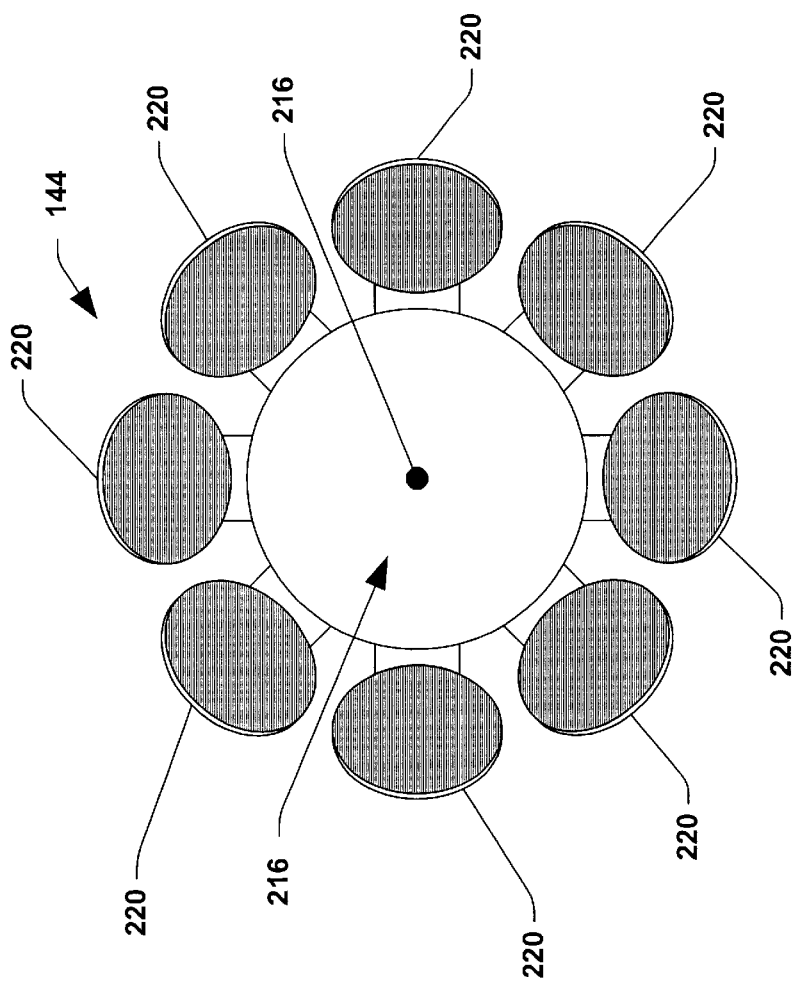
FIG. 2B is a top plan view illustrating an exemplary process disk and an associated plurality of wafer pedestals in accordance with another aspect of the invention.

The present invention will now be described with reference to the drawings wherein like reference numerals are used to refer to like elements throughout. The invention provides a system and apparatus by which a workpiece pad comprising an ordered array of micro-structures is utilized, wherein workpieces are implanted with ions in a rotating or spinning batch ion implanter process disk. The invention further includes a method of forming a workpiece pad comprising an ordered array of micro-structures. The invention thus maintains a high heat transfer rate and reduces particulate transfer and wafer sticking and adhesion forces associated with conventional batch implanters.

Referring now to the drawings, FIG. 1A illustrates an exemplary ion implanter 10, which may be employed in the batch implantation of one or more workpieces. The implanter 10 comprises a terminal 12, a beamline assembly 14, and an end station 16. The terminal 12 includes an ion source 20 powered by a high voltage power supply 22. The ion source 20 produces an ion beam 24 which is provided to the beamline assembly 14. The ion beam 24 is conditioned by a mass analysis magnet 26. The mass analysis magnet 26 passes only ions of appropriate charge-to-mass ratio to a target 30 which may include a rotating process disk (not shown) having one or more semiconductor wafers or other workpieces (not shown) mounted thereon for implantation with ions from the ion beam 24. The conditioned ion beam 24 is thus directed toward the target 30 in the end station 16.

Referring also to FIG. 1B, another exemplary batch ion implanter 100 is illustrated in greater detail, in which one or more aspects of the present invention may be advantageously employed. Implanter 100 comprises an ion source 112, a mass analysis magnet 114, a beamline assembly 115, and a target or end station 116. An expansible stainless steel bellows assembly 118, which permits movement of the end station 116 with respect to the beamline assembly 115, connects the end station 116 and the beamline assembly 115. The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The mass analysis magnet 114 functions to pass only ions of an appropriate charge-to-mass ratio to the beamline assembly 115, which comprises a resolver housing 123 and a beam neutralizer 124. The mass analysis magnet 114 includes a curved beam path 129 within a passageway 139 defined by an aluminum beam guide having side walls 130, evacuation of which is provided by a vacuum pump 131. The ion beam 128 that propagates along this path 129 is affected by the magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133. The dipole magnetic field causes the ion beam 128 to move along the curved beam path 129 from a first or entrance trajectory 134 near the ion source 112 to a second or exit trajectory 135 near the resolving housing 123. Portions 128' and 128" of the beam 128, comprised of ions having an inappropriate charge-to-mass ratio, are deflected away from the curved trajectory and into the walls of an aluminum beam guide 130. In this manner, the magnet 114 passes to the resolving housing 123 only those ions in the beam 128 which have the desired charge-to-mass ratio.

The resolver housing 123 includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer 124 and resolver housing 123 are evacuated by a vacuum pump 143. Downstream of the beam neutralizer 124 is the end station 116, which includes a disk-shaped workpiece support or process disk 144 upon which wafers to be implanted are mounted. The process disk 144 resides in a target plane which is generally perpendicularly oriented to the direction of the implant beam. The process disk 144 at the end station 116 is rotated by a motor 146 and spindle assembly 150. The ion beam thus strikes wafers mounted to the process disk 144 as they move in a circular path.

In the course of implanting ions onto a wafer or other workpiece, heat is generated in the workpiece, which must be removed therefrom in order to prevent or minimize thermal damage to the workpiece. Referring now to FIGS. 2A and 2B, an exemplary batch implanter workpiece support assembly 200 is illustrated in section according to the present invention, wherein a process disk 144 is mounted on an end of a spindle assembly 150. According to one aspect of the present invention, a cooling fluid passage 202 is illustrated in a rotating shaft 203, through which cooling fluid (e.g., water) is circulated to provide heat removal from a rotating process disk 144 via process disk circulation passages 204 located in the process disk 144. The shaft 203 is rotatably mounted in a stationary housing 210 using bearings 212 for rotation via a motor or other drive component (not shown) via a drive gear 214.

The process disk 144 rotates about an axis 216 at a center portion 217 of the process disk 144, and comprises one or more pedestals 220 extending laterally outward from the axis 216, and is further illustrated in plan view in FIG. 2B. Each of the one or more pedestals 220 comprise a workpiece pad 230 radially disposed from the axis 216 and adapted to support a workpiece (not shown) thereon, such as a semiconductor wafer. Referring again to FIG. 2A, the process disk 144 further provides fluid communication between the rotating shaft 203 and the pedestals 220 via pedestal circulation passages 232.

Referring now to FIGS. 3A and 3B, according to one exemplary aspect of the present invention, a batch ion implanter workpiece pad 230 is illustrated in section and plan view, respectively, wherein the workpiece pad 230 comprises an ordered array of substantially uniform micro-structures 250. An ordered array of substantially uniform micro-structures 250 allows uniform heat transfer across a workpiece (not shown) residing on the workpiece pad 230, as well as uniform surface adhesion across the workpiece pad due to a generally regular contact surface area across the workpiece. The workpiece pad 230 comprises a workpiece contact portion 255 and a base portion 260, wherein the workpiece contact portion 255 faces the workpiece (not shown) and the base portion 260 faces the pedestal 220. The base portion 260, for example, can be adhered to the pedestal 220 such that planar movement of the workpiece pad 230 with respect to the pedestal is substantially prohibited.

Figure 4:
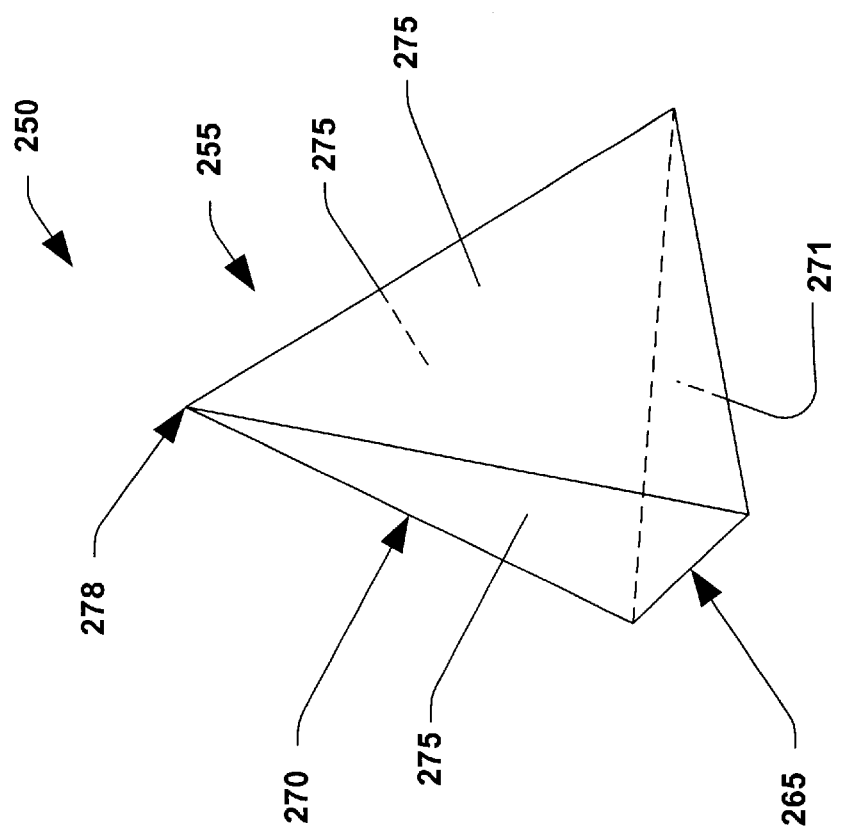
FIG. 4 is a perspective view of an exemplary micro-structure in uncompressed form.

According to one aspect of the present invention, FIG. 4 illustrates an exemplary micro-structure 250 comprising a first portion 265 integral to the base portion 260 of the workpiece pad 230 of FIG. 3A. The first portion 265 of the micro-structure 250 of FIG. 4 has a first cross-sectional area associated therewith. The micro-structure 250 further comprises a second portion 270 associated with the workpiece contact portion 255 facing the workpiece, wherein the second portion 270 extends outwardly from the first portion 265. In accordance with one exemplary aspect of the invention, the second portion 270 has a variable second cross-sectional area associated therewith. According to another exemplary aspect of the invention, the first cross-sectional area is greater than the second cross-sectional area. Each micro-structure 250 is further aligned across the workpiece pad 230 of FIG. 3A in an ordered array, such that the plurality of micro-structures 250 are uniformly distributed across the workpiece pad.

In accordance with one exemplary aspect of the present invention, each micro-structure 250 comprises a four-sided pyramid. FIG. 4 illustrates in phantom a first side 271 which is generally triangular in shape and is associated with the first portion 265 of the micro-structure 250. Three sides 275 of the four-sided pyramidical micro-structure 250 are also generally triangular in shape, and are associated with the second portion 270 of the micro-structure. The three sides 275 of the micro-structure 250 generally face the workpiece (not shown), and converge at a location 278 closest to the workpiece. The second cross-sectional area of the pyramid decreases from the first portion 265 to the location 278 closest to the workpiece. An average height of each micro-structure 250, for example, as measured from the location 278 closest to the workpiece to the first side 271, is approximately 0.0025 inches.

In accordance with another exemplary aspect of the present invention, each uniform micro-structure comprises a five-sided pyramid, wherein one of the five sides is generally rectangular in shape and is integral to the base portion 260 of the workpiece pad 230 of FIG. 3A. Four remaining sides of the five-sided pyramidical micro-structure are generally triangular in shape and face the workpiece. It should be noted that the micro-structures illustrated in the Figures are exemplary, and any uniform micro-structures can be utilized, as will be understood by one of ordinary skill in the art, and are furthermore contemplated in the present invention.

According to another exemplary aspect of the present invention, each micro-structure 250 is adapted to transfer heat from the workpiece to the workpiece pad 230, whereby the workpiece pad 230 further transfers the heat to the pedestal 220. In accordance with one aspect of the present invention, the micro-structure 250 and the workpiece pad 230 comprise a substantially resilient material, such as an vulcanized rubber or RTV compound. The substantially resilient material is adapted to significantly conduct heat, and to further compress or deflect from an original form when a force is applied to the workpiece pad 230. The substantially resilient material is furthermore adapted to substantially return to the original form when the force exerted on the workpiece pad 230 is removed.

FIGS. 5A and 5B illustrate the exemplary workpiece pad 230 in section and in plan view, respectively, wherein a workpiece 280 resides on the workpiece contact portion 255 of the workpiece pad 230. A force 285 such as gravity or centrifugal force applied to the workpiece 280 resiliently compresses the workpiece pad 230. A centrifugal force 285 may be caused by a spinning of the process disk during batch ion implantation, thus further forcing the workpiece 280 onto the workpiece pad 230 and resiliently compressing the micro-structures 250 residing on the workpiece pad 230.

Figure 6:
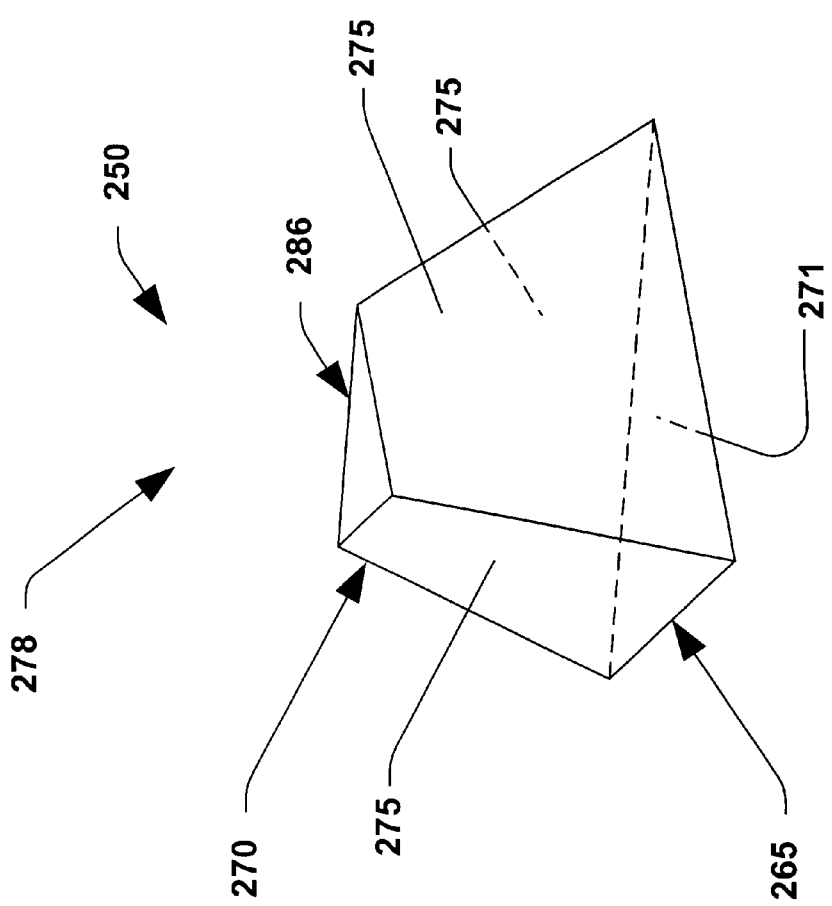
FIG. 6 is a perspective view of an exemplary micro-structure in compressed form.

The compression of the workpiece pad 230 resiliently compresses each micro-structure 250, thereby defining a contact surface area 286 associated with the workpiece contact portion 255 of each micro-structure 250, as further illustrated in FIG. 6. A size of the contact surface area 286 is associated with the force 285 applied to the workpiece 280 of FIG. 5A. Increasing the force 285 exerted on the workpiece 280 causes each micro-structure 250 to further resiliently compress, thereby resulting in an increase in the contact surface area 286 of each micro-structure 250 which is in contact with the workpiece 280.

The contact surface area 286 of each micro-structure 250 is further associated with a heat transfer rate and adhesion force for each micro-structure. Increasing the contact surface area 286 increases an amount of heat which can transfer from the workpiece 280 to the workpiece pad 230, as will be understood by one of ordinary skill in the art. One exemplary benefit of utilizing an array of uniform micro-structures 250 on a workpiece pad 230 is that heat transfer from the workpiece 280 to the workpiece pad is significantly uniform across the workpiece 280. Typical workpiece pads of prior art have heretofore achieved some level of heat sinking for removal of heat from workpieces, however, due to variable contact surface areas across the workpiece pad, uniform heat transfer across the workpiece pad may not have been achieved.

Another exemplary benefit of utilizing an ordered array of uniform micro-structures 250 on a workpiece pad 230 is that adhesion forces of the workpiece pad 230 to the workpiece 280 can be significantly uniform across the workpiece. Typical workpiece pads of the prior art have heretofore provided a significant and sometimes deleterious amount of surface adhesion to a workpiece when the workpiece is placed on the workpiece pad and spun in an ion implantation system.

Non-uniformity of workpiece pad features can cause variable adhesion characteristics across the workpiece pad. One disadvantage of having variable adhesion characteristics is that areas of high adhesion can cause possible disintegration of the workpiece and/or workpiece pad due to the workpiece sticking to the workpiece pad, resulting in disintegrated particles of the workpiece contaminating the workpiece pad or vice versa. The present invention permits uniform adhesion across the workpiece pad, thus decreasing the possibility of workpiece and workpiece pad disintegration.

According to another exemplary aspect of the present invention, each pedestal further comprises a supplemental restraint to retain the workpiece on the workpiece pad. During batch ion implantation, the process disk rotates, thus creating a centrifugal force to be exerted on the workpiece. A supplemental restraint can limit a lateral movement of the workpiece, and can also be utilized to act as a guide when placing each workpiece on the workpiece pad. Referring now to FIGS. 7A and 7B, an exemplary batch implanter pedestal 220 is illustrated in section and plan view, respectively. The pedestal 220 of FIGS. 7A and 7B comprises a plurality of tabs 300 protruding from the pedestal around the perimeter of the workpiece pad 230. The tabs 300 further laterally restrain a workpiece (not shown) on the workpiece pad 230, such that a lateral movement of the workpiece with respect to the workpiece pad is significantly prohibited. The tabs 300 as illustrated in the Figures are stationary with respect to the workpiece pad 230. Alternatively, the tabs 300 are moveable with respect to the workpiece pad 230. Furthermore, as another alternative, a combination of both stationary and moveable tabs 300 can be utilized, and fall within the scope of the present invention.

According to yet another exemplary aspect of the present invention, an exemplary wafer pedestal 220 is illustrated in FIGS. 8A and 8B in section and plan view, respectively, wherein a lip 310 attached to the pedestal 220 protrudes from the perimeter of the workpiece pad 310. The lip 310 further significantly prevents a lateral movement of the workpiece (not shown) with respect to the workpiece pad 230.

The present invention is also directed to a method of forming a substantially resilient workpiece mount support comprising an ordered array of uniform micro-structures for supporting a workpiece in a batch ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 9:
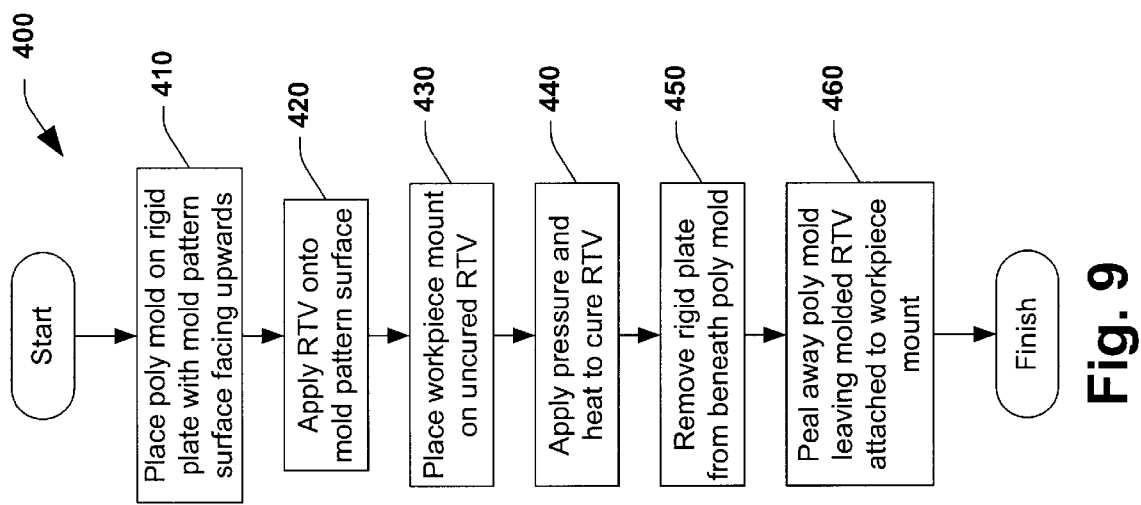
FIG. 9 is an exemplary method illustrating a formation of a workpiece pad in accordance with one aspect of the invention.

According to one exemplary aspect of the present invention, FIG. 9 illustrates method 400 of forming a workpiece support, wherein a substantially flexible mold comprising a first surface and a second surface is placed on a substantially rigid plate at step 410. As illustrated in FIG. 10A, the second surface 500 of the mold 505 faces the rigid plate 510, while the first surface 515 of the mold comprises an ordered array of inverted micro-structures 520. The mold is comprised of, for example, polypropylene, such that a mold release agent is unnecessary. Furthermore, the mold can be formed, for example, using a micro-replication process, such as that commercially available through 3M Corporation.

FIG. 10B illustrates a liquified workpiece pad material 525 being applied onto the first surface 515 of the mold 505 at step 420 of FIG. 9, wherein the liquified workpiece pad material 525 substantially covers the ordered array of inverted micro-structures 520. The liquified workpiece pad material 525 is further adapted to substantially permit bonding to a substantially rigid pedestal while substantially preventing bonding of the workpiece pad material 525 to the mold 505. For example, the liquified workpiece pad material 525 comprises an RTV silicon material, and the mold 505 comprises a polypropylene (poly) material. It should be noted that a mold release agent is not required during the formation of the workpiece support, thus eliminating any deleterious effects caused by mold release agent remaining on the finished workpiece support.

FIG. 10C illustrates placing the pedestal 530 onto the liquified workpiece pad material 525 at step 430 of FIG. 9, wherein the pedestal 530 contacts the liquified workpiece pad material 525 at a plurality of locations. As an alternative, the liquified workpiece pad material 525 is applied to the pedestal 530 at step 420, and the pedestal 530 and liquified workpiece pad material 525 are further applied to the first surface 515 of the mold 505 at step 430.

The liquified workpiece pad material 525 is further cured at step 440 of FIG. 9, thereby forming a cured resilient workpiece pad material substantially bonded to the pedestal as illustrated in FIG. 10D as item 535. According to one exemplary aspect of the invention, one or more of pressure, heat, or ultraviolet radiation are utilized to cure the liquified workpiece pad material 525. FIG. 10E illustrates removing the rigid plate (not shown) from the second surface 500 of the mold 505 at step 450 of FIG. 9. The mold 500 is then removed from the cured resilient workpiece pad material 535 at step 460, thus leaving a plurality micro-structures 545 adhered to the pedestal 530. According to one exemplary aspect of the invention, the mold 500 of FIG. 10E is removed from the cured resilient workpiece pad material 535 by substantially peeling the mold from the cured resilient workpiece pad material. FIG. 10F illustrates an exemplary finished workpiece support 540; comprising the cured resilient workpiece pad material 535 adhered to the pedestal 530, wherein the workpiece pad material 535 further comprises an array of uniform micro-structures 545.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion implantation system, comprising:
   a workpiece pad having a surface whereon a workpiece resides, wherein at least a portion of the workpiece pad surface comprises an ordered array of micro-structures;
   a pedestal whereon the workpiece pad resides;
   a process disk mounted on a shaft for rotation about an axis, wherein the process disk is adapted to support the pedestal thereon; and
   an ion source adapted to provide ions to the workpiece residing on the workpiece pad.

2. The system of claim 1, further comprising a cooling fluid source adapted to provide cooling fluid to the pedestal in order to remove heat from the workpiece pad and the workpiece.

3. The system of claim 1, wherein the process disk comprises a plurality of pedestals extending laterally outward from a center portion of the process disk, the pedestals each comprising a workpiece pad radially disposed from the axis and adapted to support a workpiece thereon.

4. An ion implantation system, comprising:
   a workpiece pad having a surface whereon a workpiece resides, wherein at least a portion of the workpiece pad surface comprises an ordered array of micro-structures;
   a pedestal whereon the workpiece pad resides, wherein each of the micro-structures comprises a base portion facing the pedestal and having a first cross-sectional area associated therewith, and a workpiece contact portion facing the workpiece and having a second cross-sectional area and workpiece contact surface area associated therewith, and wherein the first cross-sectional area is greater than the second cross-sectional area;
   a process disk mounted on a shaft for rotation about an axis, wherein the process disk is adapted to support the pedestal thereon; and
   an ion source adapted to provide ions to the workpiece residing on the workpiece pad.

5. The system of claim 4, wherein the plurality of uniform micro-structures comprise three-sided pyramids.

6. The system of claim 4, wherein the plurality of uniform micro-structures comprise four-sided pyramids.

7. The system of claim 4, wherein an average height of the plurality of uniform micro-structures is approximately 0.0025 inches.

8. The system of claim 4, wherein the workpiece pad comprises a substantially resilient material, wherein a normal force exerted on the workpiece contact portion causes the plurality of micro-structures to resiliently compress resulting in an increase in the workpiece contact surface area, thereby increasing a thermally conductive contact surface area associated therewith.

9. The system of claim 1, wherein the workpiece pad comprises an RTV compound.

10. An ion implantation system, comprising:
a workpiece pad having a surface whereon a workpiece resides, wherein at least a portion of the workpiece pad surface comprises an ordered array of micro-structures;
a pedestal whereon the workpiece pad resides, wherein the pedestal further comprises a supplemental restraint adapted to retain the workpiece on the workpiece pad;
a process disk mounted on a shaft for rotation about an axis, wherein the process disk is adapted to support the pedestal thereon; and
an ion source adapted to provide ions to the workpiece residing on the workpiece pad.

11. The system of claim 10, wherein the supplemental restraint comprises a lip protruding from the perimeter of the workpiece pad.

12. The system of claim 10, wherein the supplemental restraint comprises a plurality of tabs protruding from the perimeter of the workpiece pad.

13. The system of claim 12, wherein the plurality of tabs are stationary, moveable, or a combination of stationary and moveable.

14. A pedestal for supporting a workpiece in a batch ion implantation system, comprising a substantially resilient workpiece pad adhered to the pedestal, the workpiece pad having a surface whereon a workpiece resides, wherein the surface of the workpiece pad comprises and ordered array of micro-structures.

15. A pedestal for supporting a workpiece in a batch ion implantation system, comprising a substantially resilient workpiece pad adhered to the pedestal, the workpiece pad having a surface whereon a workpiece resides, wherein the surface of the workpiece pad comprises and ordered array of micro-structures, wherein each of the micro-structures comprises a base portion facing the pedestal and having a first cross-sectional area associated therewith, and a workpiece contact portion facing the workpiece and having a,second cross-sectional area and workpiece contact surface area associated therewith, and wherein the first cross-sectional area is greater than the second cross-sectional area.

16. The system of claim 14, wherein the plurality of uniform micro-structures comprise three-sided pyramids.

17. The system of claim 14, wherein the plurality of uniform micro-structures comprise four-sided pyramids.

18. The system of claim 14, wherein an average height of the plurality of uniform micro-structures is approximately 0.0025 inches.

19. A pedestal for supporting a workpiece in a batch ion implantation system, comprising a substantially resilient workpiece pad adhered to the pedestal, the workpiece pad having a surface whereon a workpiece resides, wherein the surface of the workpiece pad comprises and ordered array of micro-structures, and wherein the workpiece pad comprises a substantially resilient material, wherein a normal force exerted on the workpiece contact portion causes the plurality of micro-structures to resiliently compress resulting in an increase in the workpiece contact surface area, thereby increasing a thermally conductive contact surface area associated therewith.

20. The system of claim 14, wherein the workpiece pad comprises an RTV compound.

21. A pedestal for supporting a workpiece in a batch ion implantation system, comprising a substantially resilient workpiece pad adhered to the pedestal, the workpiece pad having a surface whereon a workpiece resides, wherein the surface of the workpiece pad comprises and ordered array of micro-structures, and wherein the pedestal further comprises a supplemental restraint adapted to retain the workpiece on the workpiece pad.

22. The system of claim 21, wherein the supplemental restraint comprises a lip protruding from the perimeter of the workpiece pad.

23. The system of claim 21, wherein the supplemental restraint comprises a plurality of tabs protruding from the perimeter of the workpiece pad.

24. The system of claim 23, wherein the plurality of tabs are stationary, moveable, or a combination of stationary and moveable.

25. The system of claim 14, further comprising a cooling fluid source adapted to provide cooling fluid to the pedestal in order to remove heat from the workpiece pad and the workpiece.

26. The system of claim 4, further comprising a cooling fluid source adapted to provide cooling fluid to the pedestal in order to remove heat from the workpiece pad and the workpiece.

27. The system of claim 4, wherein the process disk comprises a plurality of pedestals extending laterally outward from a center portion of the process disk, the pedestals each comprising a workpiece pad radially disposed from the axis and adapted to support a workpiece thereon.

28. The system of claim 4, wherein the workpiece pad comprises an RTV compound.

29. The system of claim 15, wherein the plurality of uniform micro-structures comprise three-sided pyramids.

30. The system of claim 15, wherein the plurality of uniform micro-structures comprise four-sided pyramids.

31. The system of claim 15, wherein an average height of the plurality of uniform micro-structures is approximately 0.0025 inches.

32. The system of claim 15, further comprising a cooling fluid source adapted to provide cooling fluid to the pedestal in order to remove heat from the workpiece pad and the workpiece.

33. The system of claim 19, wherein the workpiece pad comprises an RTV compound.

* * * * *